United States Patent [19]

Villarreal et al.

[11] 4,455,680

[45] Jun. 19, 1984

[54] METHOD AND APPARATUS FOR RECEIVING AND TRACKING PHASE MODULATED SIGNALS

[75] Inventors: Salvador Villarreal, League City; Stuart D. Lenett, Houston; Herbert S. Kobayashi, Webster; James F. Pawlowski, Houston, all of Tex.

[73] Assignee: The United States of America as represented by the Administrator of the National Aeronautics and Space Administration, Washington, D.C.

[21] Appl. No.: 147,695

[22] Filed: May 7, 1980

Related U.S. Application Data

[63] Continuation of Ser. No. 737,975, Nov. 2, 1976, abandoned.

[51] Int. Cl.³ .............................................. H04B 1/26
[52] U.S. Cl. .................................... 455/208; 455/202; 455/265; 455/260; 375/77; 375/81; 375/120; 329/124

[58] Field of Search ............... 455/202, 208, 256, 260, 455/265; 375/77, 81, 97, 119, 120; 329/50, 122, 124

[56] References Cited

U.S. PATENT DOCUMENTS

| 3,710,261 | 1/1973 | Low et al. ............................ 455/260 |
| 3,745,255 | 7/1973 | Fletcher et al. .................... 455/260 |
| 3,768,030 | 10/1973 | Brown et al. ....................... 455/260 |
| 3,806,815 | 4/1974 | Fletcher et al. ...................... 375/81 |
| 3,984,778 | 10/1976 | Bhopale .............................. 375/77 |

Primary Examiner—Jin F. Ng
Attorney, Agent, or Firm—Marvin F. Matthews; John R. Manning

[57] ABSTRACT

A receiver for tracking and demodulating several types of phase modulated communications, either analog or digital data, for either residual carrier or suppressed carrier signal and for phase modulation or keying of two, four or higher phase angles, from 0° through 360°. A carrier component signal and a converted series sideband component signal are obtained from the incoming signal and summed to produce a carrier tracking signal, permitting more accurate tracking of the above types of phase modulated data.

21 Claims, 3 Drawing Figures

METHOD AND APPARATUS FOR RECEIVING AND TRACKING PHASE MODULATED SIGNALS

ORIGIN OF THE INVENTION:

The invention described herein was made by employees of the United States Government and may be manufactured and used by or for the Government of the United States of America for governmental purposes without the payment of any royalties thereon or therefor.

This is a continuation, of application Ser. No. 737,975 filed Nov. 2, 1976, now abandoned.

BACKGROUND OF THE INVENTION:

1. FIELD OF INVENTION:

The present invention relates to receiving and tracking phase modulated signals.

2. DESCRIPTION OF PRIOR ART:

Prior art phase modulation receivers have in the past used various forms of tracking loops, such as phase-locked loops, squaring tracking loops and Costas loops to track the incoming signal carrier frequency. In each of these tracking loops, a voltage controlled oscillator (VCO) was driven through a loop filter by an error signal derived from a multiplication product of two signals. In phase-locked loops and squaring tracking loops, the output of the VCO was multiplied with the incoming signal to form the error signal. In the Costas loop, two error signals were formed. The first Costas loop error signal was formed by multiplying the VCO output, termed an I signal, with the incoming signal. The second Costas loop error signal was formed by multiplying a 90° phase shifted I signal, termed a Q signal, with the incoming signal. Examples of such tracking loop receivers are in U.S. Pat. Nos. 3,289,082; 3,546,703; 3,550,131; 3,701,948; 3,710,257; and 3,736,507.

Receivers using these tracking loops were, however, limited to quadriphase or lower (e.g., biphase) modulation and to digital data. Also, these receivers used only the error signal portion of the incoming signal in tracking.

SUMMARY OF THE INVENTION

Briefly, the present invention provides a communication system receiver for receiving either residual carrier or suppressed carrier phase modulated communication signals, and further capable of accepting N-level (higher than 4) phase modulation. The multi-level phase modulation may represent digital data or may take the form of analog phasemodulated data. The receiver of the present invention is capable of operating for low incoming signal power levels and at low signal-to-noise (S/N) ratios because residual carrier components may not be multiplied by the demodulated signal and the carrier tracking noise bandwidth can be made narrower. The term residual carrier refers to the residual component when the data-bearing signal is modulated on the carrier in such a way that a residual component at carrier frequency exists in the overall signal power spectrum.

In the receiver of the present invention, a phase detector detects the phase of the incoming signal. The detected phase is reversed and multiplied with the incoming signal to form a converted series sideband component carrier signal. The residual carrier component signal and the converted series sideband signals are then summed to form a tracking carrier signal which is multiplied with the output from the voltage controlled oscillator in the tracking loop to obtain an error signal which drives the voltage controlled oscillator in the tracking loop.

By controlling the tracking loop with a tracking signal having both carrier and converted series sideband component carrier signals, a stronger tracking signal for more numerous phase angles is obtained. The tracking signal is further less susceptible to carrier interference.

It is an object of the present invention to provide a new and improved receiver for phase modulated signals.

Figure 1:
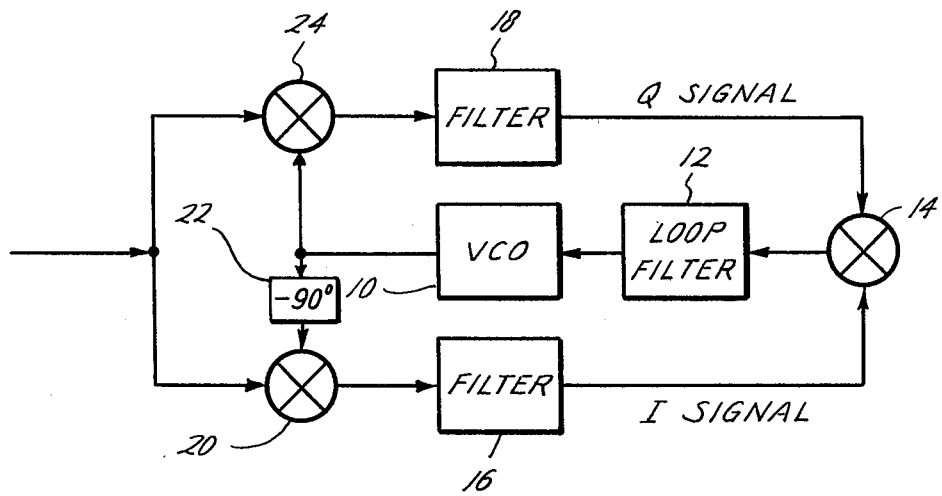
FIG. 1 is a schematic electrical circuit diagram of a prior art Costas loop tracking circuit.

DESCRIPTION OF THE PREFERRED EMBODIMENT:

At the outset, it is considered helpful to briefly discuss prior art demodulation techniques as exemplified by a Costas loop (FIG. 1). In the prior art loop, a voltagecontrolled oscillator (VCO) 10 furnished a reference signal based on an error signal furnished thereto by a loop filter 12 and a multiplier 14. The multiplier 14 received input quadrature signals known as I and Q signals from filters 16 and 18 and formed a product signal containing as a component thereof an error signal which was used to control the oscillator 10 in tracking the incoming signal. The I signal was formed by multiplying the output of the oscillator 10 with the incoming signal in the multiplier 20 after a −90° phase shift in the phase shift circuit 22, while the Q signal was formed by multiplying the output of the oscillator 10 with the incoming signal in the multiplier 24.

Although suitable for certain purposes, the prior art tracking circuits, including Costas loops, phase lock loops, and squaring tracking loops, suffered from several shortcomings. For example, these circuits were not adapted for analog or higher than four phase digital modulation without unique circuit modifications for each modulation type. Further, the circuits were not suitable for use with input signals at low power levels or at low signal-to-noise ratios because of a greater tracking noise bandwidth and different modulation types. Also, the circuits required suppressed modulation carrier transmission signals and were not suited for use with modulated communication signals having a residual carrier frequency component.

Figure 2:
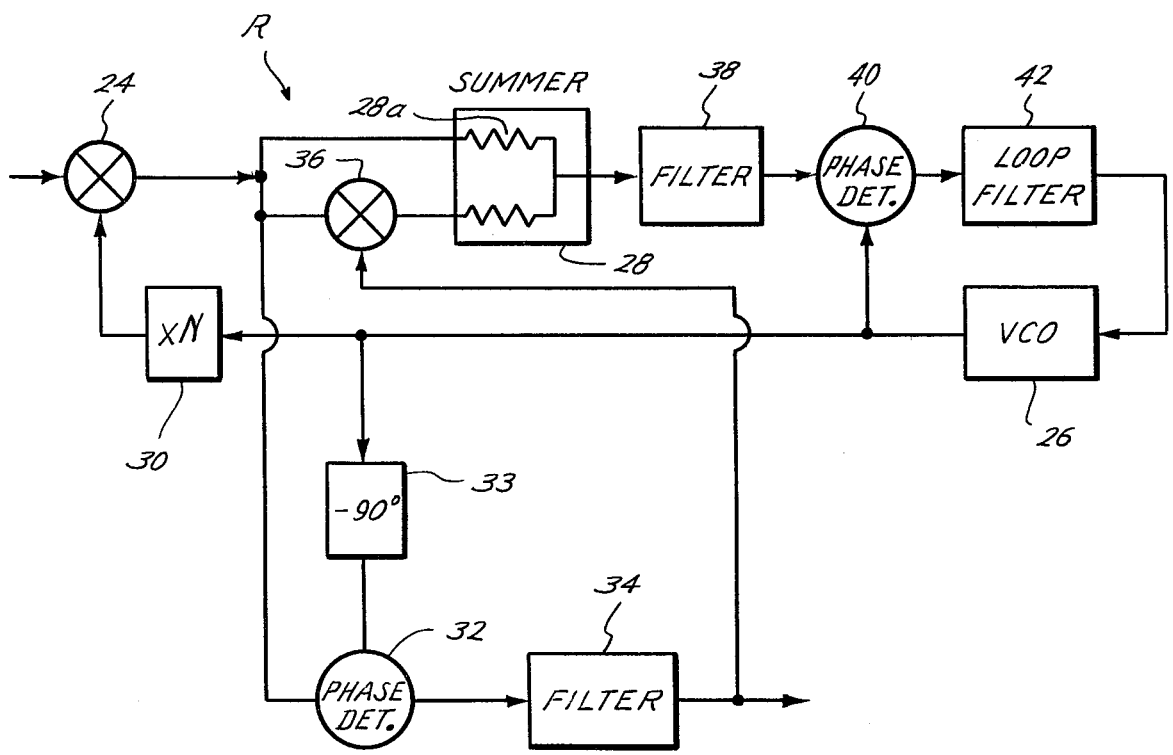
FIG. 2 is a schematic electrical circuit diagram of a receiver tracking 0° to 180° phase shift according to the present invention.

Considering now a receiver R (FIG. 2) according to the present invention, and incoming biphase modulation of 0° to 180° phase shift communication signal from a suitable communication link is multiplied in a first multiplier 24 with a local reference signal from a voltage-controlled oscillator 26. The first multiplier 24 forms a product signal, containing a signal component, termed a residual carrier signal and sideband components, representing the data modulation components and the amount of signal power in the intermediate frequency component present in the incoming signal. The product signal formed in the multiplier 24 is furnished to a summing circuit 28 at a first input thereof. When the frequency of the incoming signal differs from the frequency of the local reference signal, the reference signal may, if desired, be multiplied in a frequency multiplier circuit 30 before being furnished to the multiplier 24. In this manner, a beat frequency is obtained from the local oscillator 26 to insure that the signal formed in the first multiplier 24 includes a component at the frequency of the oscillator 26 for tracking purposes. The signal at the output of multiplier 24 consists of residual carrier and sideband components representing the data modulation components. In a Fourier series expansion of this multiplier output signal, the total of the data modulation components are all the harmonics of the carrier signal frequency and can be called the series sideband components.

The output of the first multiplier 24 is also provided as an input to a phase detector 32, a multiplier circuit where such output is multiplied with a −90° phase shifted local reference signal furnished from the oscillator 26 through a phase shift circuit 33 to demodulate and recover data from the incoming communication signal. An output band pass filter 34 is connected at the output of the phase detector 32 to filter out extraneous signals from the recovered data.

The output of the filter 34 is also furnished to a second multiplier 36 which multiplies the incoming signal from the signal output of the first multiplier 24 with the demodulated output reconstructed incoming carrier signal to form a signal, herein termed a converted series sideband carrier signal, representing the amount of signal power in the data component of the incoming signal. The term converted series sideband carrier signal therefore, refers to the product of the incoming modulated carrier signal and the demodulated signal represented by the Fourier series sideband components in a Fourier series expansion of the demodulated signal. The converted series sideband carrier signal formed in the second multiplier 36 is provided to the summing circuit 28 at a second input thereof.

The summing circuit 28 according to the present invention thus receives as an input signals representing the relative signal power in both the carrier and the data portions of the incoming signal, and forms the sum of such input signals. The summing circuit 28 performs also to adjust time delay of the two input signals. In certain instances, weighted summing is preferable in summing circuit 28. For example, if suppressed carrier data is expected as the incoming signal, the output signal from multiplier 24 to summing circuit 28 will be noise. In this situation, the impedance of a resistor 28a in summing circuit 28 may be increased to block out the undesirable noise and increase tracking accuracy.

The output of the summing circuit 28 is provided through a bandpass filter 38 to a tracking loop phase detector multiplier 40. The tracking loop phase detector multiplier 40 multiplies the filtered output of the summing circuit 30 with the output of the oscillator 26 to form an error signal provided through a loop filter 42 to control the frequency of the oscillator 26 and track the incoming signal frequency.

By combining the residual carrier signal and sideband component carrier signals to produce a tracking carrier signal in accordance with the present invention, both residual carrier signals and suppressed carrier signals may be detected and tracked. Further, where zero residual carrier or suppressed carrier, as set forth above, or with a residual carrier signal having substantial interference, the receiver R of the present invention is capable of tracking even in these situations, since the converted series sideband carrier signal is provided to the summing circuit 28. Further, by obtaining the series sideband component of the incoming signal in the second multiplier 24, tracking is performed at lower signal-to-noise ratios and for lower input signal power levels, as well.

Figure 3:
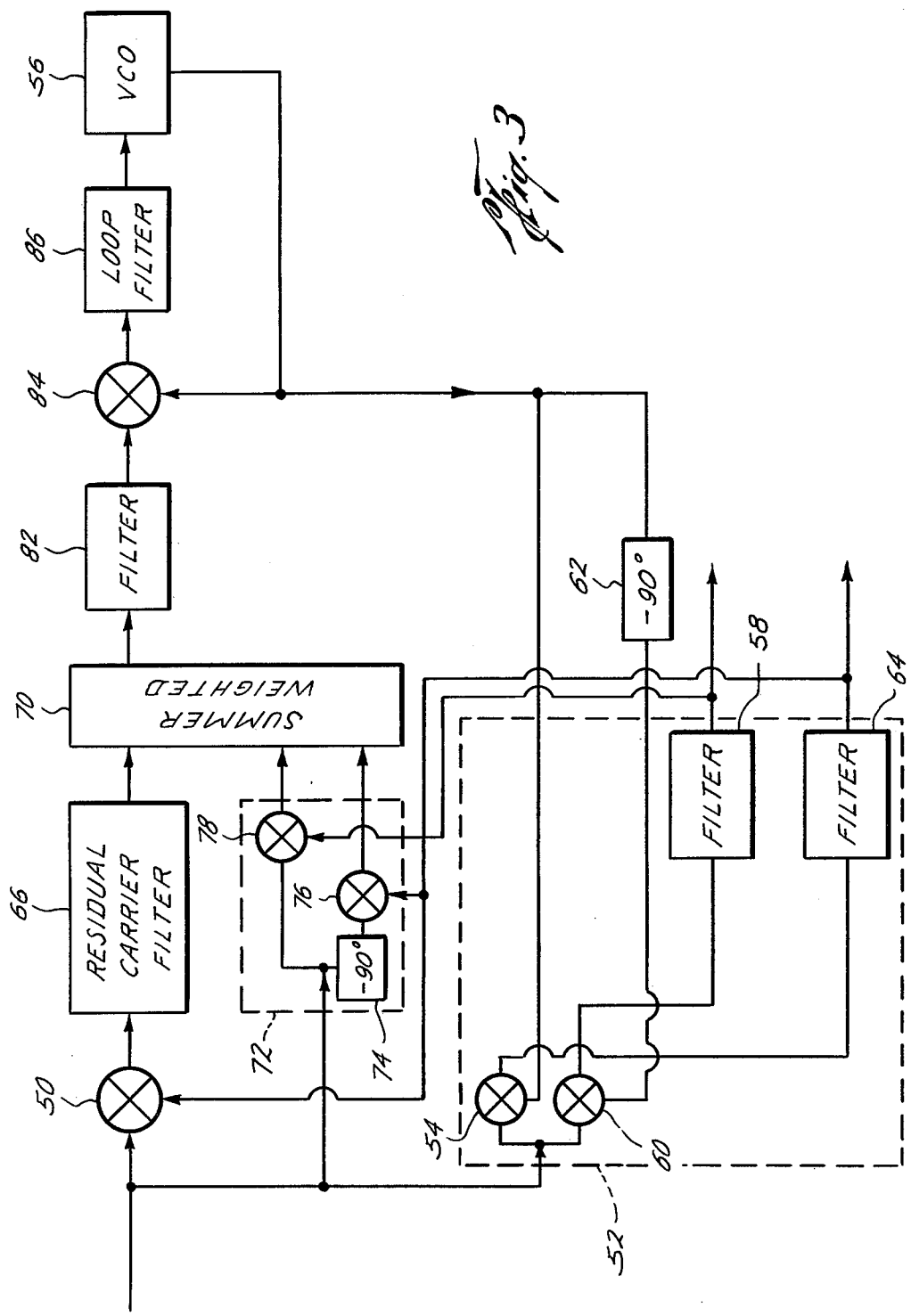
FIG. 3 is a schematic electrical circuit diagram of another receiver tracking 0° to 360° phase shift according to the present invention.

In a receiver R-1 (FIG. 3) of the present invention, incoming quadriphase modulated signals are detected and tracked. The receiver R-1 is further suitable for tracking incoming analog or digital phase modulated signals of 0° to 360° phase shift. Further, higher than four phase digital modulation is permitted with the receiver R-1.

Considering now the receiver R-1 more in detail, the incoming data is received at a first multiplier 50 and at a phase detector 52. In the phase detector 52, a first phase detector multiplier 54 multiplies the incoming communication signal with the output of a phase locked loop voltage-controlled oscillator 56 to obtain a first incoming data signal, which is provided as an output through a filter 64.

Similarly, a second phase detector multiplier 60 multiplies the incoming communication signal with a signal from the oscillator 56 phase shifted −90° by a phase shift circuit 62 to obtain a second incoming data signal provided as an output through a filter 58.

The output of the first multiplier 50 is a residual carrier signal representing the amount of power in the incoming signal present at the carrier frequency, as set forth above. The output of the first multiplier 50 is formed by the product of the incoming signal and the signal from filter 64. The residual carrier signal from the first multiplier 50 is provided through a bandpass filter 66 centered at the carrier frequency to a summing circuit 70.

The outputs of filters 58 and 64 of the phase detector 52 are provided to a second multiplier circuit 72 for forming first and second converted series sideband component carrier signals, representing the amount of power in the incoming signal present in the data. In the multiplier circuit 72, a phase shift circuit 74 shifts the phase of the incoming signal, and the multiplier 76 multiplies the phase shifted incoming signal with the output of the filter 64 to form the first converted series sideband component carrier signal, which is provided as an input to the summing circuit 70. The summing circuit 70 sums the residual carrier component signal and also sums the inphase and quadrature converted series sideband signal to produce the phase of the tracking carrier signal.

A multiplier circuit 78 of the second multiplier circuit 72 multiplies the incoming communication signal with the output of the filter 58 to form a second converted series sideband carrier signal, which is also furnished to the summing circuit 70. As set forth above, the summing function performed in summing circuit 70 may be varied and weighted in accordance with the expected incoming signal.

As was the case with the receiver R, by combining the residual carrier signal and the first and second converted series sideband component carrier to produce a combined tracking signal in the summing circuit 70 of the receiver R-1, both residual carrier signals and suppressed carrier signals may be detected and tracked. Further, where zero residual carrier or suppressed carrier, as set forth above, or with a residual carrier signal having substantial interference, the receiver R-1 is capable of tracking even in these situations, since the converted series sideband carrier signal is provided to the summing circuit 70. Further, by obtaining the series sideband component of the incoming signal in the second multiplier 72, tracking is peformed at lower signal-to-noise ratios and for lower input signal power levels, as well.

The output of the summing circuit 70 is furnished through a filter 82 to a phase locked loop multiplier 84 which multiplies the output of the oscillator 56 with the combined tracking signal to form a tracking error signal provided through a loop filter 86 to control the tracking by oscillator 56.

From the foregoing, it can be seen that by forming a combined carrier tracking signal according to the present invention, a stronger and better tracking signal for various phase angles, either digital or analog modulation, is obtained, since the combined tracking carrier signal includes both carrier signal and converted data signals. With the combined tracking carrier signal, the receivers R and R-1 of the present invention are less susceptible to carrier interference which has in some instances in the past degraded tracking.

The foregoing disclosure and description of the invention are illustrative and explanatory thereof, and various changes in the size, shape, materials, components, circuit elements, wiring connection and contacts as well as in the details of the illustrated circuitry and construction may be made without departing from the spirit of the invention.

We claim:

1. A receiver for tracking and demodulating an incoming phase modulated communication signal, comprising:
   (a) oscillator means for forming a local reference signal;
   (b) phase detector means for detecting the phase of said incoming signal modulated with respect to said local reference signal;
   (c) means for obtaining a residual carrier signal from said phase detected signal and said incoming signal;
   (d) multiplier means for obtaining a converted series sideband carrier signal, representing the reconstructed incoming signal, from said phase detected signal and said incoming signal; and
   (e) means for summing said residual carrier signal and said converted series sideband carrier signal to form a tracking carrier signal for controlling said oscillator means thereby to track said incoming signal.

2. The receiver of claim 1, wherein said means for summing comprises:
   means for weighted summing the residual carrier signal and the converted series sideband carrier signal to form a tracking carrier signal controlling said oscillator means to track the incoming signal.

3. The receiver of claim 1, wherein said oscillator mean comprises:
   (a) voltage controlled oscillator means forming the local reference signal at a frequency controlled by an input error signal; and
   (b) oscillator multiplier means for multiplying the tracking carrier signal with the local reference signal to form the error signal.

4. The receiver of claim 3, wherein said oscillator means further includes:
   loop filter means for passing the input error signal from said oscillator multiplier means to said voltage controlled oscillator means.

5. The receiver of claim 1, wherein said phase detector means comprises:
   detector multiplier means for multiplying the local reference signal with the incoming signal to detect the phase thereof.

6. The receiver of claim 1, wherein the incoming signal is a biphase signal and wherein said phase detector means comprises:
   phase detector multiplier means for multiplying the incoming signal with the local reference signal.

7. The receiver of claim 6, further including:
   means at the input of said phase detector means for multiplying for phase shifting the local reference signal.

8. The receiver of claim 1, further including:
   means for filtering the output of said phase detector means.

9. The receiver of claim 1, wherein the incoming signal is a quadriphase signal and wherein said phase detector means comprises:
   phase detector multiplier means for multiplying the incoming signal with the local reference signal.

10. The receiver of claim 9, wherein said phase detector means further comprises:
    (a) a phase shift circuit for shifting the phase of the local reference signal by $-90°$;
    (b) second phase detector multiplier means coupled to receive the phase shifted local reference signal and for multiplying the incoming signal with the phase shifted local reference signal from said phase shift circuit 11. The receiver of claim 10, wherein said multiplier means comprises:
    (a) means for phase shifting the incoming signal;
    (b) means for multiplying the phase-shifted incoming signal with the output of said first phase detector multiplier means; and
    (c) means for multiplying the incoming signal with the outputs of said second phase detector multiplier means.

12. The receiver of claim 11, wherein said means for summing comprises:
    means for summing the residual carrier signal with the outputs of both said means for multiplying in said multiplier means.

13. A method of tracking and demodulating an incoming phase modulated communication signal, comprising the steps of:
    (a) forming a local reference signal;
    (b) detecting the phase of said incoming signal modulated with respect to said local reference signal;
    (c) obtaining a residual carrier signal from said phase detected signal and said incoming signal;
    (d) obtaining a converted series sideband carrier signal representing the reconstructed incoming signal from said phase detected signal and said incoming signal; and
    (e) summing said residual carrier signal and said converted series sideband carrier signal to form a tracking carrier signal for controlling the tracking of said incoming signal.

14. The method of claim 14, further including the step of:
    filtering the detected phase of the incoming signal.

15. The method of claim 13, wherein said step of summing comprises:
   weighted summing the residual carrier signal and the converted series sideband carrier signal to form the tracking carrier signal.

16. The method of claim 13, wherein said step of forming a local reference signal comprises:
   (a) forming the local reference signal at a frequency controlled by an input error signal; and
   (b) multiplying the tracking carrier signal with the local reference signal to form the error signal.

17. The receiver of claim 13, wherein said step of detecting the phase comprises:
   multiplying the local reference signal with the incoming signal to detect the phase thereof.

18. The method of claim 13, wherein the incoming signal is a bi-phase signal.

19. The method of claim 18, further including the step of:
   phase shifting the local reference signal.

20. The method of claim 13, wherein the incoming signal is a quadriphase signal, and wherein said step of detecting the phase comprises:
   multiplying the incoming signal with the local reference signal.

21. The method of claim 20, further including the step of:
   forming a signal representing the product of the incoming signal and the local reference signal.

* * * * *